US010151647B2

(12) United States Patent
Brown et al.

(10) Patent No.: US 10,151,647 B2
(45) Date of Patent: Dec. 11, 2018

(54) INTEGRATED SOI PRESSURE SENSOR HAVING SILICON STRESS ISOLATION MEMBER

(71) Applicant: Honeywell International Inc., Morristown, NJ (US)

(72) Inventors: Gregory C. Brown, Chanhassen, MN (US); Curtis Rahn, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 305 days.

(21) Appl. No.: 13/921,568

(22) Filed: Jun. 19, 2013

(65) Prior Publication Data

US 2014/0374846 A1 Dec. 25, 2014

(51) Int. Cl.
*G01L 19/14* (2006.01)
*G01L 9/00* (2006.01)
(Continued)

(52) U.S. Cl.
CPC ............. *G01L 1/18* (2013.01); *G01L 19/146* (2013.01); *H01L 41/04* (2013.01); *H01L 41/22* (2013.01)

(58) Field of Classification Search
CPC ..................... G01L 19/146; G01L 19/145
See application file for complete search history.

(56) References Cited

U.S. PATENT DOCUMENTS 3,213,681 A * 10/1965 Pearson ............... G01L 9/0054
257/417
4,085,620 A * 4/1978 Tanaka ............... G01L 19/0038
73/727
(Continued)

FOREIGN PATENT DOCUMENTS

CN 102374915 3/2012
CN 102980711 3/2013
(Continued)

OTHER PUBLICATIONS

Brown, "Integrated Referenc Vacuum Pressure Sensor With Atomic Layer Deposition Coated Input Port", "U.S. Appl. No. 13/778,445, filed Feb. 27, 2013", Feb. 27, 2013, pp. 1-25.
(Continued)

*Primary Examiner* — Manish S Shah
*Assistant Examiner* — Herbert K Roberts
(74) *Attorney, Agent, or Firm* — Fogg & Powers LLC

(57) ABSTRACT

In one embodiment a pressure sensor is provided. The pressure sensor includes a housing having an input port configured to allow a media to enter the housing. A support is mounted within the housing, the support defining a first aperture extending therethrough. A stress isolation member is mounted within the first aperture of the support, the stress isolation member defining a second aperture extending therethrough, wherein the stress isolation member is composed of silicon. sensor die bonded to the stress isolation member. The sensor die includes a silicon substrate having an insulator layer on a first side of the silicon substrate; and sensing circuitry disposed in the insulator layer on the first side, wherein a second side of the silicon substrate is exposed to the second aperture of the stress isolation member and the second side is reverse of the first side.

20 Claims, 3 Drawing Sheets

(51) Int. Cl.
*G01L 1/18* (2006.01)
*H01L 41/04* (2006.01)
*H01L 41/22* (2013.01)

(56) References Cited

U.S. PATENT DOCUMENTS

| | | | |
|---|---|---|---|
| 4,773,269 | A | 9/1988 | Knecht et al. |
| 4,790,192 | A | 12/1988 | Knecht et al. |
| 4,846,191 | A | 7/1989 | Brockway et al. |
| 5,242,863 | A * | 9/1993 | Xiang-Zheng ........ G01L 9/0042 148/DIG. 128 |
| 5,515,732 | A | 5/1996 | Willcox et al. |
| 6,050,145 | A | 4/2000 | Olson et al. |
| 6,148,673 | A | 11/2000 | Brown |
| 6,229,190 | B1 | 5/2001 | Bryzek et al. |
| 6,255,728 | B1 | 7/2001 | Nasiri et al. |
| 6,425,290 | B2 | 7/2002 | Willcox et al. |
| 6,431,003 | B1 | 8/2002 | Stark et al. |
| 6,647,794 | B1 | 11/2003 | Nelson et al. |
| 7,416,910 | B2 | 8/2008 | Foote et al. |
| 7,475,597 | B2 | 1/2009 | Brida et al. |
| 7,775,119 | B1 | 8/2010 | Suminto et al. |
| 8,037,770 | B2 | 10/2011 | Larson et al. |
| 8,065,917 | B1 | 11/2011 | Brown et al. |
| 8,230,743 | B2 | 2/2012 | Wade et al. |
| 8,215,176 | B2 | 7/2012 | Ding et al. |
| 8,253,230 | B2 | 8/2012 | Janzen et al. |
| 8,487,387 | B2 | 7/2013 | Lin et al. |
| 8,535,984 | B2 | 9/2013 | Racz et al. |
| 8,536,626 | B2 | 9/2013 | Brown et al. |
| 8,701,496 | B1 | 4/2014 | Brown |
| 8,883,536 | B2 | 11/2014 | Brown |
| 2003/0205089 | A1 | 11/2003 | Nelson et al. |
| 2004/0226383 | A1* | 11/2004 | Romo ................ G01L 19/0061 73/729.2 |
| 2008/0006092 | A1 | 1/2008 | Brida et al. |
| 2008/0016683 | A1 | 1/2008 | Brida et al. |
| 2008/0110269 | A1* | 5/2008 | Strietzel ................ G01L 9/0075 73/718 |
| 2008/0315334 | A1 | 12/2008 | Martin |
| 2009/0071260 | A1 | 3/2009 | Speldrich |
| 2010/0043563 | A1 | 2/2010 | Kageyama et al. |
| 2010/0171514 | A1* | 7/2010 | Bernstein .................. F41H 1/02 324/649 |
| 2010/0224004 | A1* | 9/2010 | Suminto ............. B81C 1/00158 73/727 |
| 2010/0251825 | A1 | 10/2010 | Kurtz et al. |
| 2010/0281994 | A1 | 11/2010 | Brown et al. |
| 2011/0283802 | A1 | 11/2011 | Brown et al. |
| 2012/0042734 | A1 | 2/2012 | Wade et al. |
| 2013/0098160 | A1 | 4/2013 | Rozgo et al. |
| 2013/0276544 | A1 | 10/2013 | Potasek et al. |

FOREIGN PATENT DOCUMENTS

| | | |
|---|---|---|
| CN | 104006914 A | 8/2014 |
| GB | 1248087 | 9/1971 |
| JP | S552742 | 1/1980 |
| JP | H04506257 A | 10/1992 |
| JP | H064301 | 2/1994 |
| JP | 3149544 B2 | 3/2001 |
| JP | 3203560 B2 | 8/2001 |
| JP | 2009080095 A | 4/2009 |
| JP | 2010509573 A | 3/2010 |
| JP | 2014163935 A | 9/2014 |

OTHER PUBLICATIONS

European Patent Office, "Extended European Search Report for Serial No. 14171624.1", "from Foreign Counterpart to U.S. Appl. No. 13/921,568", dated Nov. 19, 2014, pp. 1-12, Published in: EP.
European Patent Office, "Communication Pursuant to Article 94(3) from EP Application No. 14171624.1 dated Nov. 24, 2017", "from Foreign Counterpart to U.S. Appl. No. 13/921,568", Nov. 24, 2017, pp. 1-10, Published in: EP.
State Intellectual Property Office, P.R. China, "First Office Action for CN Application No. 201410365904", "Foreign Counterpart to U.S. Appl. No. 13/921,568", dated Dec. 19, 2017, pp. 1-18, Published in: CN.
Japanese Patent Office; "Notice of Allowance from JP Application No. 2014-030620 dated Nov. 14, 2017"; from Foreign Counterpart of U.S. Appl. No. 13/778,465; dated Nov. 14, 2017; pp. 1-3; Published: JP.
Japanese Patent Office; "Notice of Allowance from JP Application No. 2014-123204 dated Mar. 21, 2018"; from Foreign Counterpart of U.S. Appl. No. 13/921,568; dated Mar. 21, 2018; pp. 1-3; Published: JP.
State Intellectual Property Office, P.R. China; "Office Action from CN Application No. 201410365904.4 dated Dec. 19, 2017"; from Foreign Counterpart of U.S. Appl. No. 13/921,568; pp. 1-18; dated Dec. 19, 2017; Published: CN.
U.S. Patent and Trademark Office, "Notice of Allowance", "U.S. Appl. No. 13/778,465", dated Feb. 5, 2014, pp. 1-12, Published in: US.
U.S. Patent and Trademark Office, "Restriction Requirement", "U.S. Appl. No. 13/778,465", dated Oct. 29, 2013, pp. 1-7, Published in: US.
U.S. Patent and Trademark Office; "Notice of Allowance"; U.S. Appl. No. 14/191,006; dated Jul. 28, 2014; pp. 1-16; Published: US.
United Kingdom Intellectual Property Office, "Office Action from GB Application No. GB1402345.1 dated Jul. 30, 2014", "from Foreign Counterpart of U.S. Appl. No. 13/778,465", dated Jul. 30, 2014, pp. 1-5, Published in: GB.

* cited by examiner

INTEGRATED SOI PRESSURE SENSOR HAVING SILICON STRESS ISOLATION MEMBER

BACKGROUND

Silicon pressure sensors offer multiple benefits that include small size, good quality, and stable performance. Further, since multiple identical sensors can be fabricated simultaneously on a single wafer, silicon pressure sensors are also cost effective to manufacture. In at least one example of a pressure sensor, piezo-resistors are fabricated on a silicon diaphragm such that the piezo-resistors sense the strain in the diaphragm as the diaphragm reacts to pressure applied by the pressure media. Even when the pressure media is clean dry air, the silicon sensing die requires some form of isolation from the environment. For absolute sensors this is provided by the normal SiO2 layer that is formed. The clean dry air is contained to only contact the side of the diaphragm that does not contain metal traces and pads. That surface is exposed only to a reference vacuum. For precision applications where the pressure media is limited to air, the silicon diaphragm can be mounted on a stress isolation member.

In one embodiment, the stress isolation member is a Pyrex tube. The Pyrex tube surface is hygroscopic in nature and absorbs H2O from the pressure media over time. This change in water content alters the tube geometry slightly, which cause the sensing element to drift. In addition to long term drift due to differences in the coefficient of expansion of silicon and Pyrex, and due to stresses produced during assembly processes, the pressure sensors need extensive conditioning to remove early drift components. Finally, unwanted leakage currents between the piezo-resistors and the housing of the sensor or external electrical connection can occur. The thin coating of silicon oxide that naturally forms is often relied on to provide electrical isolation. This film also can absorb water, which also may produce sensor drift.

SUMMARY

In one embodiment a pressure sensor is provided. The pressure sensor includes a housing comprising an input port configured to allow a media to enter the interior of the housing when the housing is placed in an environment containing the media. A support is mounted within the housing, the support defining a first aperture extending therethrough. A stress isolation member is mounted within the first aperture of the support, the stress isolation member defining a second aperture extending therethrough, wherein the stress isolation member is composed of silicon. sensor die bonded to the stress isolation member. The sensor die includes a silicon substrate having an insulator layer on a first side of the silicon substrate; and sensing circuitry disposed in the insulator layer on the first side, wherein a second side of the silicon substrate is exposed to the second aperture of the stress isolation member and the second side is reverse of the first side.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
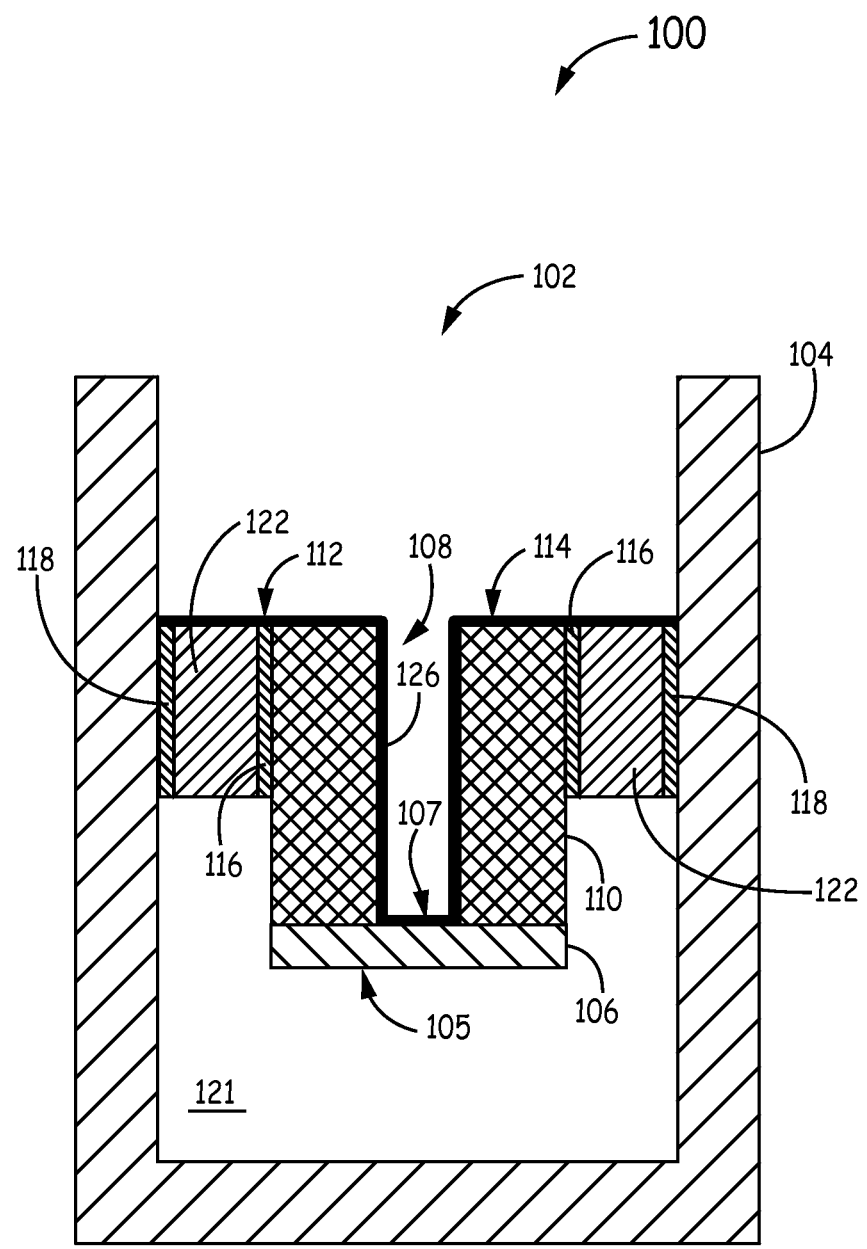
FIG. 1 is a diagram illustrating a cross-sectional view of a pressure sensing device having a integrated silicon-on-insulator (SOI) sensor and a silicon stress isolation member according to an embodiment described in the present disclosure.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

In at least one embodiment, a sensor die functioning as a diaphragm may be mounted on the stress isolation member (pedestal) that defines a first aperture extending through a stress isolation member so that a pressure media can pass through the aperture and exert pressure on the diaphragm. The sensor die can be composed of a silicon on insulator substrate and a stress isolation member can be composed of silicon such that the sensor die and the stress isolation member can have substantially equal coefficients of thermal expansion. This can also enable the sensor die and the stress isolation member to be fabricated at the wafer level.

In further embodiments, the sensor die and the stress isolation member can be mounted within a second aperture of a support, where the second aperture extends through the support. The support can be mounted to a housing of the pressure sensor and can provide electrical connection and a pressure port for the sensor die.

In still further embodiments, moisture absorption, due to hygroscopic materials of the pressure sensor device, is avoided by coating surfaces of such materials that are exposed to the pressure media with a protective layer through atomic layer deposition. To prevent the surfaces of the support, stress isolation member, and the sensor die from absorbing moisture in a pressure media, some or all of these surfaces that are exposed to the pressure media can be coated with a protective layer through an atomic layer deposition process.

Figure 2:
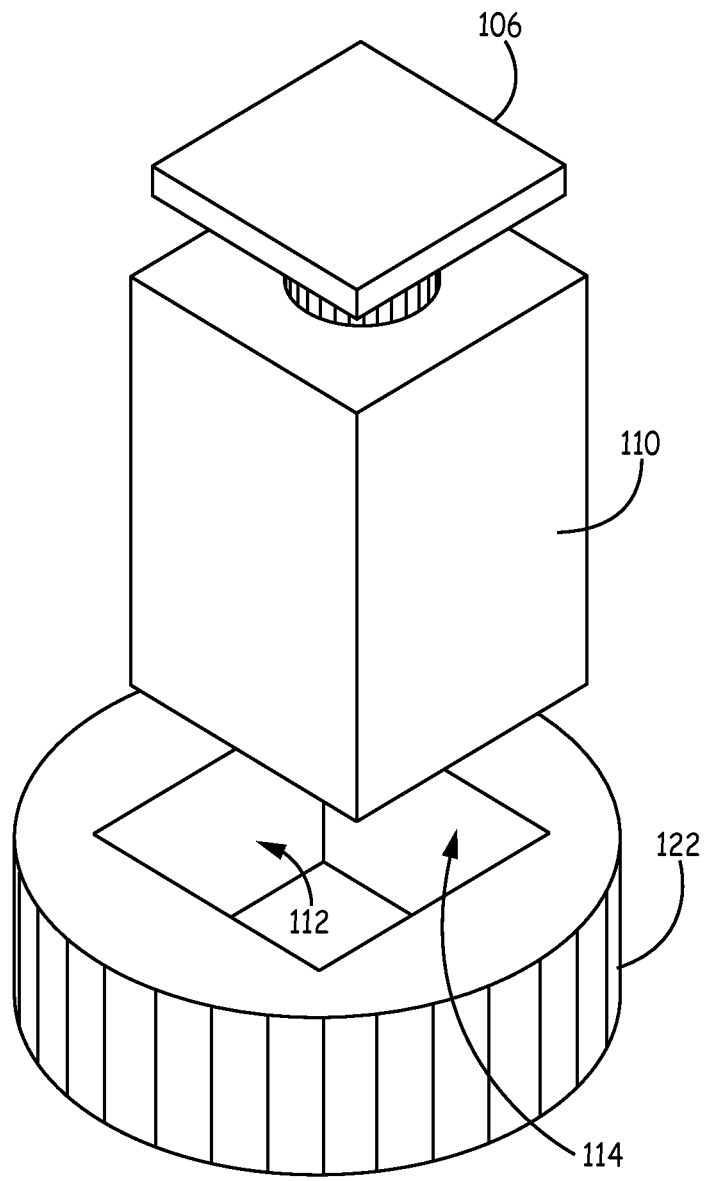
FIG. 2 is a diagram illustrating an exploded perspective view of a sensor die, stress isolation member, and support of the pressure sensing device of FIG. 1 according to an embodiment described in the present disclosure.

An example pressure sensing device 100 is now described with respect to FIGS. 1 and 2. FIG. 1 is a cross-section view of a pressure sensing device 100 and FIG. 2 is an exploded perspective view of a portion of the pressure sensing device 100. The pressure sensing device 100 is capable of measuring the pressure in certain media. For example, the pressure media sensed by the pressure sensing device 100 may include air or a liquid. To sense the pressure of the pressure media, the pressure sensing device 100 includes an input port 102, wherein the input port 102 allows the pressure media to enter a housing 104. The housing 104 protects the pressure sensing device 100 from environmental influences that can damage the pressure sensing device 100 or affect the performance of the pressure sensing device 100.

To sense the pressure of the pressure media inside the housing 104, the pressure sensing device 100 includes a sensor die 106. In at least one implementation, the sensor die 106 is a piezo-resistive silicon pressure sensing die, where piezo-resistors formed on a first side 105 of the sensor die 106, respond to strain in the sensor die 106. The sensor die 106 includes a silicon diaphragm with sensor circuitry, such as the piezo-resistors, formed on the diaphragm. The piezo-resistors change resistance in accordance with movement of the diaphragm.

In an embodiment, the sensor die 106 comprises a silicon-on-insulator (SOI) substrate having the sensing circuitry fabricated thereon. In particular, the sensor die 106 is composed of a silicon substrate having an insulator layer on the first side 105 thereof. The insulator layer can be formed on the silicon substrate in any suitable manner such as by epitaxial growth. The sensing circuitry is fabricated in the insulator layer on the first side 105 of the silicon substrate. Accordingly, the insulator layer has a thickness sufficient to enable fabrication of piezo-resistors therein. The sensor die 106 also has a second side 107 that is reverse of the first side 105. After fabrication of the sensor die 106, the second side 107 may naturally form a thin silicon oxide layer upon exposure to air or other media.

Stress to the housing 104 may affect the components of the pressure sensing device 100 that are located within the housing 104. While some of the components within the housing are minimally affected by stress, strain on the piezo-resistor located on the sensor die 106, caused by stress on the housing 104, can negatively affect the accuracy of pressure measurements made by the pressure sensing device 100. For example, strain on the housing 104 may strain the sensor die 106 in a way that is similar to the strain applied to the diaphragm of the sensor die 106 by a pressure media, which leads to bias in pressure measurements derived from the sensor die 106. In certain implementations, to isolate the sensor die 106 from stress on the housing 104 or other components in the sensing device 100, the sensor die 106 is mounted on a stress isolation member 110. The stress isolation member 110 isolates the sensor die 106 from strain applied on the housing 104 or caused by other components within the housing 104.

In certain embodiments, the stress isolation member 110 is composed of silicon. In particular, the stress isolation member 110 can be composed of a silicon substrate having an aperture 108 defined therein. The aperture 108 extends all the way through the silicon substrate. The stress isolation member 110 is mounted to the second side 107 of the sensor die 106 such that the aperture 108 extends from and is open to the second side 107 of the sensor die 106 on one end and is open to pressure media on the other end. The stress isolation member 110 is also referred to as a pedestal. The stress isolation member 110 extends away from the second side 107 of the sensor die 106. In an example, the sensor die 106 is mounted to a first end of the stress isolation member 110 and the support 122 is mounted proximate a second end 114 of the stress isolation member 110, wherein the second end 114 is reverse of the first end.

In at least one embodiment, to expose the sensor die 106 to the pressure media, the pressure media enters the housing 104 through the input port 102 and then passes through the aperture 108 in the stress isolation member 110. The pressure media within the aperture 108 applies a force against the sensor die 106, which force causes the piezo-resistors to strain as a diaphragm in the sensor die 106 moves in accordance with the pressure applied by the pressure media. The strain on the piezo-resistor changes the resistance of piezo-resistors in the piezo-resistor. As a known current passes through the piezo-resistor, the voltage drop due to the resistance of the piezo-resistors may be used to determine the pressure of the pressure media against the diaphragm of the sensor die 106. In at least one embodiment, the piezo-resistors include both pressure sensing elements and temperature sensing elements.

As also shown in FIG. 2, in some embodiments, the sensor die 106 and the stress isolation member 110 have substantially the same cross-sectional dimensions when viewed with the sensor die 106 proximate the viewer and the stress isolation member 110 extending away from the viewer. In such embodiments, the cross-sectional size of the sensor die 106 and the stress isolation member 110 is limited by the sensor die 106 and not the stress isolation member 110. Accordingly, the overall cross-section can be maintained small. In an example, both the sensor die 106 and the stress isolation member 110 have rectangular (e.g., square) cross-sections.

Advantageously, with the stress isolation member 110 composed of the same material (silicon) as the sensor die 106, the stress isolation member 110 and the sensor die 106 can achieve substantially the same coefficient of thermal expansion. Thus, when the stress isolation member 110 and/or sensor die 106 experience thermal expansion, the stress isolation member 110 and the sensor die 106 expand at the same rate to reduce the stress applied to the piezo-resistors formed on the sensor die 106 due to thermal expansion. In an example, the crystalline orientation of the stress isolation member 110 and of the sensor die 106 are aligned in order to further match the coefficients of thermal expansion.

The sensor die 106 is bonded to the stress isolation member 110 using a low temperature diffusion process. In such a process, surface activation of the silicon surface allows the low temperature silicon to silicon, surface to surface bonding. Such low temperature bonding can be at or below 600 degrees Celsius and, in a particular example is around 400-450 degrees Celsius.

In an example, the stress isolation member 110 has a generally rectangular cuboid shape with the aperture 108 extending therethrough. In an implementation of such an example, the aperture 108 extends longitudinally through the long dimension of the rectangular cuboid shape. In an example, the long dimension of the rectangular cuboid shape is around 0.156 inches in length, which is substantially longer than the thickness of the sensor die 106.

In certain embodiments, the second side 107 of the sensor die 106 is exposed to the pressure media in the aperture 108 and an opposite side of the sensor die 106 is exposed to a reference chamber 121. The reference chamber 121 is a sealed environment having a known pressure. In an example, the reference chamber 121 is maintained as a vacuum. The housing 104 can be sealed to maintain the pressure in the reference chamber 121. The sensing circuitry on the first side 105 of the sensor die 106 can be electrically coupled to components and/or connections on the housing 104 or other electronics associated with the housing 104. Accordingly, the signals from the piezo-resistors on the sensor die 106 are sent through wires that are bonded to the first surface 105 of the sensor die 106 within the reference chamber 121, where the wires extend directly from the sensor die 106 to the further electronics such as front end circuitry. The front end circuitry includes electronics that, in part, function to control the input to the electrical elements on the sensor die 106. For example, the front end circuitry includes analog to digital converters, digital to analog converters, multi chip modules and the like. In at least one implementation, the front end circuitry performs functionalities such as pressure output characterization, output signal conditioning, and the like.

In certain embodiments, the front end circuitry is electrically connected to an electrical connector that is welded to the housing 104 with a hermetic weld. The electrical connector extends from the housing 104 and connects to an external system. The electrical connector can be threaded to aid in the integration of the pressure sensing device 100 in a larger system. Thus, through the electrical connector, an external system is able to acquire pressure measurements from the piezo-resistors on the sensor die 106.

In an example, a getter may be placed within the reference chamber 121. The getter can be activated according to methods known to those having skill in the art. The getter can absorb any remnant gaseous molecules present in the reference chamber 121 after bonding and absorbs molecules that are out gassed from elements in the reference chamber 121 after bonding.

In at least one implementation, when the sensor die 106 is mounted on the stress isolation member 110, the stress isolation member 110 is mounted to a support 122. In certain exemplary implementations, the support 122 is composed of a ceramic, such as an alumina blank, or other brazeable material having a coefficient of thermal expansion similar to silicon. The stress isolation member 110 can be mounted to the support 122 using a braze 116. The support 122 includes an aperture 112 into which the stress isolation member 110 is mounted. The aperture 112 has a cross-section and size that corresponds to an outer cross-section of the stress isolation member 110, such that the stress isolation member 110 can be inserted therein. In the example shown in FIGS. 1 and 2, the aperture 112 and the outer cross-section of the stress isolation member 110 are rectangular. Accordingly, the outer surface of the stress isolation member 110 is attached to the inner surface of the support 122, for example, with a braze 116. The support 122 is attached to the housing 104 to provide the mechanical coupling between the sensor die 106 and stress isolation member 110 assembly and the housing 104. Portions of the outer surface of the support 122 can be mounted to the housing 104. In an example, the support 122 is bonded to the housing 104 through a braze 118. Alternatively, the stress isolation member 110 and the substrate 122 are bonded to the housing through a solder joint.

When a stress isolation member 110 is manufactured from silicon, and when the silicon material interacts with air in the pressure media, a layer of hygroscopic silicon dioxide forms. The silicon dioxide can absorb moisture out the air and causes the stress isolation member 210 to change shape. The stress isolation member 110 may expand in such a way that the piezo-resistors on the sensor die 106 become strained, thus causing a bias in the measurements produced by the piezo-resistors. In certain embodiments, the stress isolation member 110 is protected from moisture by an atomic layer deposition (ALD) coating 126 that prevents the moisture in the pressure media from contacting the stress isolation member 110. For example, the ALD coating 126 includes a coating of metal oxide that is deposited on the surfaces of the stress isolation member 110 and the substrate 122 that are exposed to the pressure media. In at least one embodiment, the coating 226 is a metal oxide such as alumina or titanium oxide. In particular, these surfaces include the interior surfaces of the aperture 108. Other surfaces can also be included such as an end face 114 of the stress isolation member 110. In one exemplary implementation, the ALD coating 126 is applied before the stress isolation member 110 and the substrate 122 are mounted within the housing 104. Alternatively, the ALD coating 126 is applied after the stress isolation member 110 and the substrate 122 are mounted within the housing 104. In some examples, the ALD coating 126 can be placed on the portion of the second surface 107 of the sensor die 106 that is exposed within the aperture 108 of the stress isolation member 110. Moreover, in the some examples, the ALD coating is placed on surfaces of the support 122 that are exposed to pressure media.

Advantageously, the SOI geometry of the sensor die 106 can provide a secondary isolation for any leakage paths through the ALD coating. The SOI geometry can also allow the pressure sensor to be operated at temperatures above 125 degrees Celsius, where reverse bias diode leakage currents can become problematic.

Figure 3:
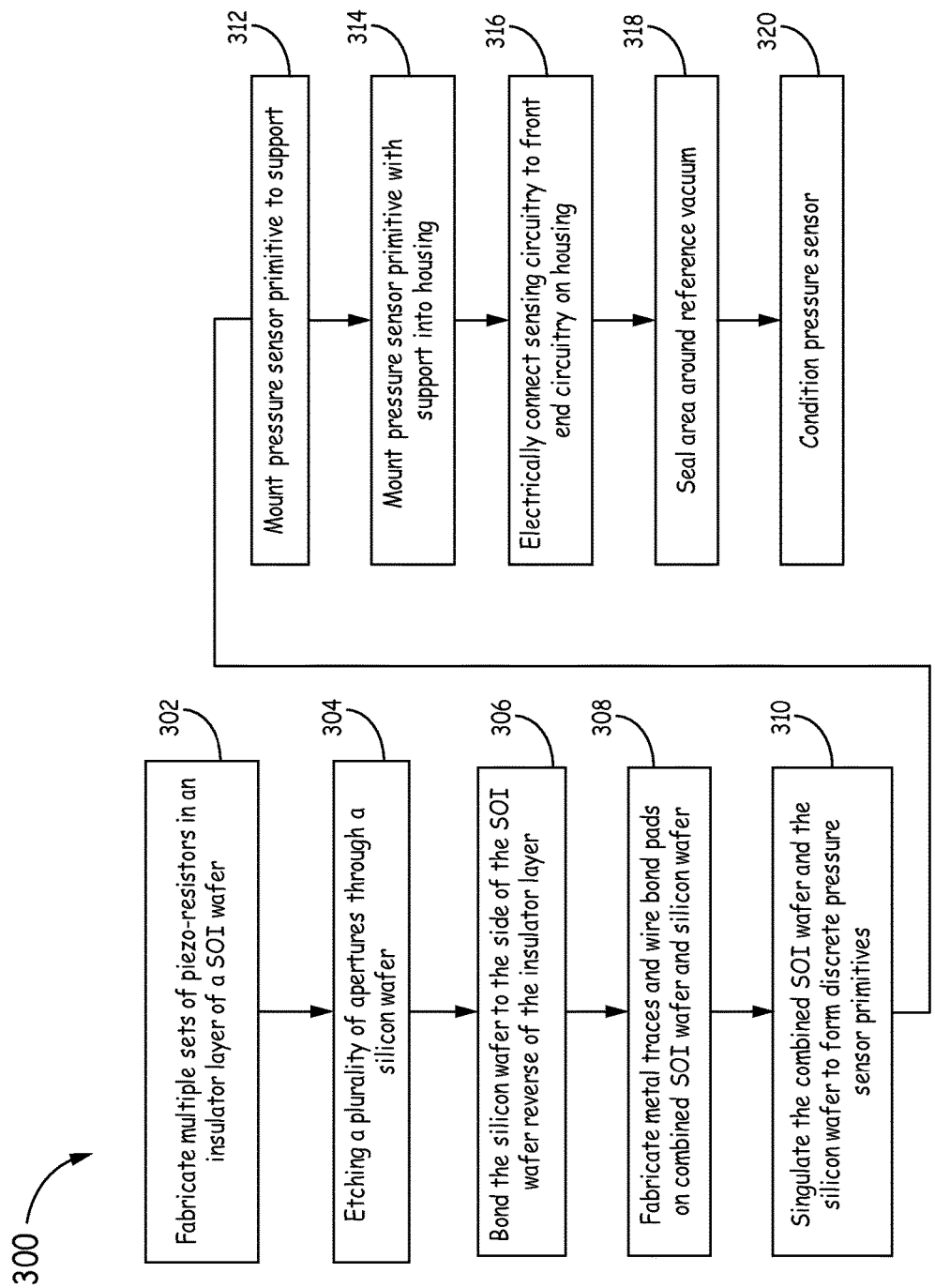
FIG. 3 is a flow diagram illustrating a method for fabricating the pressure sensing device of FIG. 1 according to an embodiment described in the present disclosure.

FIG. 3 is a flow diagram of one exemplary embodiment of a method 300 for fabricating the pressure sensor 100. Advantageously, since the sensor die 106 and the stress isolation member 110 are composed of silicon, the sensor die 106 and the stress isolation member 110 can be fabricated and bonded together at the wafer level, where multiple sensor dies 106 and stress isolation members 110 are fabricated simultaneously.

Sensor dies 106 can be formed by fabricating multiple sets of piezo-resistors are fabricated in an insulator layer of a silicon-on-insulator (SOI) wafer (302). The SOI wafer corresponds to the substrate of multiple sensor dies 106, and the insulator layer corresponds to the first side 105 of the sensor die 106. The insulator layer of the SOI wafer can be formed in any suitable manner such as by epitaxial growth of on a silicon substrate. In such an example, the insulator layer is grown thick enough to be used for forming piezo-resistors. Each set of piezo-resistors corresponds to the piezo-resistors for sensing circuitry of a single sensor die 106. The sets of piezo-resistors can be positioned on the SOI wafer using any suitable wafer level plan. To fabricate the piezo-resistors, the insulator layer is appropriately doped and etched to form the piezo-resistor structures. An etch is also performed to form a cavity for each sensing circuitry, the cavity for use by a diaphragm. Once the piezo-resistors and cavities are formed, the diffusion surface of the SOI wafer is polished flat. In an example, metalized paths and pads are not applied at this time.

A plurality of through holes (apertures 108) can be etched in a second silicon wafer to form a plurality of stress isolation members 110 (304). Each aperture 108 can extend all the way through the silicon wafer and can correspond to the aperture 108 extending through a stress isolation member 110. The apertures 108 can be positioned on the silicon wafer in a manner that corresponds to the positioning of the sets of piezo-resistors on the SOI wafer, and in a particular example to the position of the cavity for the diaphragm of each sensing circuitry, such that each aperture 108 matches up with a set of piezo-resistors and, in particular, a diaphragm. The silicon wafer can be selected as a wafer having the same crystalline orientation as the SOI wafer.

Once the piezo-resistors are fabricated in the SOI wafer and the through holes are etched in the silicon wafer, the SOI wafer and the silicon wafer can be bonded together (306). The silicon wafer is bonded to the side of the SOI wafer reverse of the insulator layer; the side that is reverse of the insulator layer corresponds to the second side 107 of the sensor die 106. Bonding the SOI wafer to the silicon wafer includes aligning the apertures 108 in the silicon wafer with the sets of piezo-resistors and/or cavities for diaphragms. For example, each aperture 108 can be aligned with a cavity for a diaphragm and/or aligned with a set of piezo-resistors. Since the silicon wafer is bonded to the side of the SOI wafer that is reverse of the insulator layer, the apertures 108 are aligned piezo-resistors and/or cavities while being disposed proximate this second side 107. The silicon wafer is then bonded to the SOI wafer in this alignment. That is, the apertures 108 are aligned with the reverse side of the piezo-resistors and/or cavities. In an example, the silicon wafer is also bonded to the SOI wafer such that the crystalline orientation of the silicon wafer is aligned with the crystalline orientation of the SOI wafer, as mentioned above. The silicon wafer and the SOI wafer can be bonded together using a low temperature using a low temperature diffusion process. In such a process, surface activation of the side of the SOI wafer that is reverse of the insulator layer and surface activation of a surface of the silicon wafer allows the low temperature silicon to silicon, surface to surface bonding. Such low temperature bonding can be at or below 600 degrees Celsius and, in a particular example is around 400 or 450 degrees Celsius.

Metal traces and wire bonding pads are then fabricated on the insulator layer of the combined SOI wafer and silicon wafer (308). The metal traces can effectuate appropriate connections in each set of piezo-resistors to one another and to the wire bonding pads.

The combined SOI wafer and silicon wafer are then singulated (e.g., sawed) to form multiple discrete pressure sensor primitives (310), each pressure sensor primitive including a sensor die 106 (a singulated portion of the SOI wafer) bonded to a stress isolation member 110 (a corresponding singulated portion of the silicon wafer).

A pressure sensor primitive is then mounted to a support 122 having an aperture 112 therein (312). In an example, the pressure sensor primitive is mounted to a support 122 by brazing the external surface of the stress isolation member 110 to an internal surface of the aperture 112 of the support 122. This braze 116 is vacuum tight. In an example, the sensor die 106 is mounted to a first end of the stress isolation member 110 and the support 122 is mounted proximate a second end 114 of the stress isolation member 110, wherein the second end 114 reverse of the first end.

The pressure sensor primitive mounted to the support 122 is then mounted within the housing 104 (314). For example, the pressure sensor primitive and support 122 are placed within a housing 104 having an input port 102 such that pressure media entering the input port 102 is able to enter the opening of the aperture 108 on the stress isolation member 110. In at least one exemplary embodiment, the pressures sensor primitive with the support 122 can be mounted into the housing 104 by attaching the support 122 to the housing 104 using a braze 118. This braze 118 is vacuum tight.

The sensing circuitry on the sensor die 106 can be electrically connected to components on the housing 104, such as front end circuitry (316). For example, pads on the sensor die 106 can be wire bonded to the components to electrically connect the sensing circuitry on the sensor die 106 to the wire bonds.

The area around the reference chamber 121 in the housing 104 is then sealed to form the reference chamber 121 (318). Finally, the pressure sensor is conditioned to remove the tendency for the sensor measurement to drift over time (320).

Example Embodiments

Example 1 includes a pressure sensor comprising: a housing comprising an input port configured to allow a media to enter the interior of the housing when the housing is placed in an environment containing the media; a support mounted within the housing, the support defining a first aperture extending therethrough; a stress isolation member mounted within the first aperture of the support, the stress isolation member defining a second aperture extending therethrough, wherein the stress isolation member is composed of silicon; a sensor die bonded to the stress isolation member, the sensor die including: a silicon substrate having an insulator layer on a first side of the silicon substrate; and sensing circuitry disposed in the insulator layer on the first side, wherein a second side of the silicon substrate is exposed to the second aperture of the stress isolation member and the second side is reverse of the first side.

Example 2 includes the pressure sensor of Example 1, wherein the stress isolation member comprises a pedestal extending away from the second side of the silicon substrate, wherein the second aperture extends longitudinally through the pedestal, the sensor die being mounted to a first end of the pedestal, wherein the support is mounted proximate a second end of the pedestal, the second end reverse of the first end.

Example 3 includes the pressure sensor of any of Examples 1 or 2, wherein the support is fabricated from a ceramic having a coefficient of thermal expansion similar to silicon.

Example 4 includes the pressure sensor of any of Examples 1-3, further comprising an atomic layer deposition coating that covers an interior surface of the stress isolation member and the second side of the silicon substrate which are exposed to the media.

Example 5 includes the pressure sensor of Example 4, wherein the atomic layer deposition coating covers a portion of the support.

Example 6 includes the pressure sensor of any of Examples 4 or 5, wherein the atomic layer deposition comprises a metal oxide.

Example 7 includes the pressure sensor of any of Examples 1-6, wherein the housing defines a vacuum reference chamber, and the first side of the sensing die is exposed to the vacuum reference chamber.

Example 8 includes the pressure sensor of any of Examples 1-7, wherein the support and the stress isolation member are mounted together using a braze.

Example 9 includes the pressure sensor of any of Examples 1-8, wherein a crystalline orientation of the stress isolation member is substantially aligned with a crystalline orientation of the sensor die.

Example 10 includes a method for fabricating a pressure sensor, the method comprising: fabricating multiple sets of piezo-resistors in an insulator layer of a first silicon wafer, wherein each set of piezo-resistors corresponds to sensing circuitry for a sensor die; etching a plurality of through holes in a second silicon wafer, wherein each through hole corresponds to an first aperture for a stress isolation member; bonding the second silicon wafer to a side of the first silicon wafer reverse of the insulator layer using a low temperature diffusion process, wherein bonding includes aligning the second silicon wafer with the first silicon wafer such that each through hole is reverse of a set of piezo-resistors; singulating the first and second silicon wafers to form a plurality of discrete pressure sensor primitives, each pressure sensor primitive including: a sensor die composed of a portion of the first silicon wafer including a set of piezo-resistors; and a stress isolation member composed of a portion of the second silicon wafer, the stress isolation member including the aperture; providing a plurality of supports, each support defining a second aperture having a cross-section that substantially matches an outer cross section of the stress isolation member; mounting each pressure sensor primitive to a support such that a portion of the outer surface of each stress isolation member is attached to the inner surface of the second aperture of a corresponding support.

Example 11 includes the method of Example 10, comprising: coating surfaces of the stress isolation member and the sensor die that will be exposed to media with an atomic layer deposition of a metal oxide.

Example 12 includes the method of any of Examples 10 or 11, comprising: after bonding the second silicon wafer to the first silicon wafer, fabricating metal traces and wire bonding pads on a side of the first silicon wafer having the insulator layer to form sensing circuitry.

Example 13 includes the method of Example 12, comprising: attaching each pressure sensor device with a support mounted thereto to a housing; and sealing the housing such that the side of the sensor die having the sensing circuitry is within an environment having a known pressure and is hermetically isolated from the second aperture of the stress isolation member.

Example 14 includes the method of Example 13, wherein attaching each pressure sensor primitive with a support to a housing includes one of brazing or soldering each support to a corresponding housing.

Example 15 includes the method of any of Examples 12-14, wherein bonding includes bonding at lower than 600 degrees Celsius.

Example 16 includes the method of any of Examples 12-15, wherein bonding the second silicon wafer to a side of the first silicon wafer includes aligning a crystalline orientation of the second silicon wafer with a crystalline orientation of the first silicon wafer.

Example 17 includes the method of any of Examples 12-16, wherein mounting each pressure sensor primitive to a support including brazing the pressure sensor device to the support.

Example 18 includes the method of any of Examples 12-17, wherein fabricating multiple sets of piezo-resistors includes: doping the insulator layer of the sensor die; etching the insulator layer to form the multiple sets of piezo-resistors; and polishing a diffusion surface flat.

Example 19 includes a pressure sensor comprising: a housing comprising an input port configured to allow a media to enter the interior of the housing when the housing is placed in an environment containing the media; a support mounted within the housing, the support defining a first aperture extending therethrough, wherein the support is fabricated from a ceramic having a coefficient of thermal expansion similar to silicon; a stress isolation member mounted within the first aperture of the support, the stress isolation member defining a second aperture extending therethrough, wherein the stress isolation member is composed of silicon; a sensor die bonded to the stress isolation member using a low temperature diffusion process, the sensor die including: a silicon substrate having an insulator layer on a first side of the silicon substrate, wherein a crystalline orientation of the stress isolation member is substantially aligned with a crystalline orientation of the silicon substrate of the sensor die; and sensing circuitry disposed in the insulator layer on the first side, wherein a second side of the silicon substrate is exposed to the second aperture of the stress isolation member and the second side is reverse of the first side; and a metal oxide atomic layer deposition coating that covers an interior surface of the stress isolation member, the second side of the silicon substrate, and a portion of the support.

Example 20 includes the pressure sensor of Example 19, wherein the stress isolation member extends away from the second side of the silicon substrate, wherein the second aperture extends longitudinally through the stress isolation member, the sensor die being mounted to a first end of the stress isolation member, wherein the support is mounted proximate a second end of the stress isolation member, the second end reverse of the first end.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

What is claimed is:

1. A pressure sensor comprising:
   a housing comprising an input port configured to allow a media to enter the interior of the housing when the housing is placed in an environment containing the media;
   a support mounted within the housing, the support defining a first aperture having a uniform cross-section extending through the support, and wherein the support is composed of an insulating material having a coefficient of thermal expansion similar to silicon;
   a stress isolation member mounted within the first aperture of the support, the stress isolation member having a rectangular cuboid shape and defining a second aperture extending longitudinally through the rectangular cuboid shape, wherein the stress isolation member is composed of silicon, and wherein the cross-section of the first aperture substantially matches an outer cross section of the stress isolation member; and
   a sensor die bonded to the stress isolation member, the sensor die including:
      a silicon substrate having an insulator layer on a first side of the silicon substrate; and
      sensing circuitry disposed in the insulator layer on the first side, wherein a second side of the silicon substrate is exposed to the second aperture of the stress isolation member and the second side is reverse of the first side; and wherein the second side of the silicon substrate is bonded to a first surface of the stress isolation member to form a silicon to silicon bond between the sensor die and the stress isolation member.

2. The pressure sensor of claim 1, wherein the stress isolation member comprises a pedestal extending away from the second side of the silicon substrate, wherein the second aperture extends longitudinally through the pedestal, the sensor die being mounted to a first end of the pedestal, wherein the support is mounted proximate a second end of the pedestal, the second end reverse of the first end.

3. The pressure sensor of claim 1, wherein the support is fabricated from a ceramic having a coefficient of thermal expansion similar to silicon.

4. The pressure sensor of claim 1, further comprising an atomic layer deposition coating that covers an interior surface of the stress isolation member and the second side of the silicon substrate which are exposed to the media.

5. The pressure sensor of claim 4, wherein the atomic layer deposition coating covers a portion of the support.

6. The pressure sensor of claim 4, wherein the atomic layer deposition comprises a metal oxide.

7. The pressure sensor of claim 1, wherein the housing defines a vacuum reference chamber, and the first side of the sensing die is exposed to the vacuum reference chamber.

8. The pressure sensor of claim 1, wherein the support and the stress isolation member are mounted together using a braze.

9. The pressure sensor of claim 1, wherein a crystalline orientation of the stress isolation member is substantially aligned with a crystalline orientation of the sensor die.

10. A method for fabricating a pressure sensor, the method comprising:
    fabricating multiple sets of piezo-resistors in an insulator layer of a first silicon wafer, wherein each set of piezo-resistors corresponds to sensing circuitry for a sensor die;
    etching a plurality of through holes in a second silicon wafer, wherein each through hole corresponds to an first aperture for a stress isolation member;
    bonding the second silicon wafer to a side of the first silicon wafer reverse of the insulator layer using a low temperature silicon-to-silicon, surface-to-surface, diffusion process, wherein bonding includes aligning the second silicon wafer with the first silicon wafer such that each through hole is reverse of a set of peizo-resistors;
    singulating the first and second silicon wafers to form a plurality of discrete pressure sensor primitives, each pressure sensor primitive including:
        a sensor die composed of a portion of the first silicon wafer including a set of piezo-resistors; and
        a stress isolation member composed of a portion of the second silicon wafer, the stress isolation member having a rectangular cuboid shape and defining the first aperture extending longitudinally through the rectangular cuboid shape;
    providing a plurality of supports, each support defining a second aperture having a uniform cross-section extending through the support, and wherein the cross-section of the second aperture substantially matches an outer cross section of the stress isolation member, and wherein each support is composed of an insulating material having a coefficient of thermal expansion similar to silicon;
    mounting each pressure sensor primitive to a support such that a portion of the outer surface of each stress isolation member is attached to the inner surface of the second aperture of a corresponding support.

11. The method of claim 10, comprising:
    coating surfaces of the stress isolation member and the sensor die that will be exposed to media with an atomic layer deposition of a metal oxide.

12. The method of claim 10, comprising:
    after bonding the second silicon wafer to the first silicon wafer, fabricating metal traces and wire bonding pads on a side of the first silicon wafer having the insulator layer to form sensing circuitry.

13. The method of claim 12, comprising:
    attaching each pressure sensor device with a support mounted thereto to a housing; and
    sealing the housing such that the side of the sensor die having the sensing circuitry is within an environment having a known pressure and is hermetically isolated from the second aperture of the stress isolation member.

14. The method of claim 13, wherein attaching each pressure sensor primitive with a support to a housing includes one of brazing or soldering each support to a corresponding housing.

15. The method of claim 12, wherein bonding includes bonding at lower than 600 degrees Celcius.

16. The method of claim 12, wherein bonding the second silicon wafer to a side of the first silicon wafer includes aligning a crystalline orientation of the second silicon wafer with a crystalline orientation of the first silicon wafer.

17. The method of claim 12, wherein mounting each pressure sensor primitive to a support including brazing the pressure sensor device to the support.

18. The method of claim 12, wherein fabricating multiple sets of piezo-resistors includes:
    doping the insulator layer of the sensor die;
    etching the insulator layer to form the multiple sets of piezo-resistors; and
    polishing a diffusion surface flat.

19. A pressure sensor comprising:
    a housing comprising an input port configured to allow a media to enter the interior of the housing when the housing is placed in an environment containing the media;
    a support mounted within the housing, the support defining a first aperture having a uniform cross-section extending through the support, wherein the support is fabricated from a ceramic having a coefficient of thermal expansion similar to silicon;
    a stress isolation member mounted within the first aperture of the support, the stress isolation member having a rectangular cuboid shape and defining a second aperture extending longitudinally through the rectangular cuboid shape, wherein the stress isolation member is composed of silicon, and wherein the cross-section of the first aperture substantially matches an outer cross section of the stress isolation member;
    a sensor die bonded to the stress isolation member using a low temperature diffusion process, the sensor die including:
        a silicon substrate having an insulator layer on a first side of the silicon substrate, wherein a crystalline orientation of the stress isolation member is substantially aligned with a crystalline orientation of the silicon substrate of the sensor die; and
        sensing circuitry disposed in the insulator layer on the first side, wherein a second side of the silicon substrate is exposed to the second aperture of the stress isolation member and the second side is reverse of the first side;
        wherein the second side of the silicon substrate is bonded to a first surface of the stress isolation member to form a silicon to silicon bond between the sensor die and the stress isolation member; and
    a metal oxide atomic layer deposition coating that covers an interior surface of the stress isolation member, the second side of the silicon substrate, and a portion of the support.

20. The pressure sensor of claim 19, wherein the stress isolation member extends away from the second side of the silicon substrate, wherein the second aperture extends longitudinally through the stress isolation member, the sensor die being mounted to a first end of the stress isolation member, wherein the support is mounted proximate a second end of the stress isolation member, the second end reverse of the first end.

* * * * *